(12) United States Patent
Dernis et al.

(10) Patent No.: US 9,674,988 B2
(45) Date of Patent: Jun. 6, 2017

(54) METHOD AND DEVICE FOR REDUCING THE ENERGY CONSUMPTION OF A CENTER COMPRISING ENERGY-INTENSIVE APPARATUSES

(75) Inventors: Michel Dernis, Neuilly sur Seine (FR); Thierry Duflos, Levallois-Perret (FR)

(73) Assignee: ATRIUM DATA, Paris (FR)

( * ) Notice: Subject to any disclaimer, the term of this patent is extended or adjusted under 35 U.S.C. 154(b) by 1325 days.

(21) Appl. No.: 13/518,561

(22) PCT Filed: Dec. 20, 2010

(86) PCT No.: PCT/FR2010/052834
§ 371 (c)(1),
(2), (4) Date: Aug. 27, 2012

(87) PCT Pub. No.: WO2011/086279
PCT Pub. Date: Jul. 21, 2011

(65) Prior Publication Data
US 2012/0309284 A1    Dec. 6, 2012

(30) Foreign Application Priority Data
Dec. 22, 2009 (FR) .................................... 09 59429

(51) Int. Cl.
*H05K 7/20* (2006.01)
*F24F 11/00* (2006.01)
*F24F 7/00* (2006.01)

(52) U.S. Cl.
CPC ...... *H05K 7/20745* (2013.01); *F24F 11/0001* (2013.01); *F24F 2007/004* (2013.01)

(58) Field of Classification Search
CPC ....................................................... H05K 7/20
(Continued)

(56) References Cited

U.S. PATENT DOCUMENTS 6,634,422 B2 * 10/2003 Rayburn et al. ............... 165/250
6,651,452 B2 * 11/2003 Lecke et al. ..................... 62/230
(Continued)

FOREIGN PATENT DOCUMENTS

DE    20 2004 003309 U1    8/2004

OTHER PUBLICATIONS

International Search Report, dated Apr. 28, 2011, from corresponding PCT application.

*Primary Examiner* — Steven B McAllister
*Assistant Examiner* — Samantha Miller
(74) *Attorney, Agent, or Firm* — Young & Thompson (57) ABSTRACT

A center includes a main room having a number of rows of bays, which hold functional energy-intensive pieces of equipment having air intake passages located functionally beside their front surface and air discharge passages located beside their rear surface, and cooling elements associated with passages, with the arrangement of the bays and functional equipment being such that a pair of two rows, whose back-to-back surfaces are the rear surfaces, defines a hot passage where the air discharge passages, in which the air is hot, are accessible at a temperature $T_3$ that is higher than the temperature $T_2$ of the tempered air found in the portion of the main room that is outside the hot passage and from which the front surfaces and the air intake passages are accessible, and air-conditioning elements for providing filtered air, whose flow rate, temperature $T_2$, and hygrometric degree are suitable for optimal operation of functional.

25 Claims, 2 Drawing Sheets

(58) Field of Classification Search
USPC .......................................................... 454/184
See application file for complete search history.

(56) References Cited

U.S. PATENT DOCUMENTS

| | | | |
|---|---|---|---|
| 6,859,366 B2 * | 2/2005 | Fink ............................... 361/690 |
| 6,867,967 B2 * | 3/2005 | Mok ......................... 361/679.49 |
| 7,430,118 B1 | 9/2008 | Noteboom et al. |
| 7,800,900 B1 * | 9/2010 | Noteboom et al. ...... 361/679.47 |
| 7,903,403 B2 * | 3/2011 | Doll et al. .................. 361/679.5 |
| 8,031,468 B2 * | 10/2011 | Bean et al. .................... 361/696 |
| 8,184,435 B2 * | 5/2012 | Bean et al. .................... 361/696 |
| 8,320,125 B1 * | 11/2012 | Hamburgen et al. ......... 361/695 |
| 8,441,789 B2 * | 5/2013 | Wu et al. ................. 361/679.49 |
| 8,628,158 B2 * | 1/2014 | Caveney .................... 312/265.3 |
| 8,701,737 B2 * | 4/2014 | Mainers et al. ................... 160/1 |
| 8,764,528 B2 * | 7/2014 | Tresh et al. ................... 454/184 |
| 8,820,395 B2 * | 9/2014 | Yatskov ........................ 165/176 |
| 8,914,155 B1 * | 12/2014 | Shah et al. .................... 700/282 |
| 8,918,218 B2 * | 12/2014 | Grabinger et al. ........... 700/276 |
| 8,964,374 B1 * | 2/2015 | Sheng et al. ............. 361/679.49 |
| 9,066,450 B2 * | 6/2015 | Bednarcik et al. |
| 9,072,200 B2 * | 6/2015 | Dersch et al. |
| 9,144,172 B2 * | 9/2015 | Bergthold et al. |
| 2002/0055329 A1 * | 5/2002 | Storck et al. ................. 454/186 |
| 2005/0170770 A1 * | 8/2005 | Johnson et al. .............. 454/184 |
| 2006/0168975 A1 | 8/2006 | Malone et al. |
| 2006/0234621 A1 * | 10/2006 | Desrochers et al. .......... 454/239 |
| 2006/0260338 A1 * | 11/2006 | VanGilder et al. .......... 62/259.2 |
| 2007/0171613 A1 | 7/2007 | McMahan et al. |
| 2008/0055848 A1 | 3/2008 | Hamburgen et al. |
| 2009/0210096 A1 | 8/2009 | Stack et al. |
| 2009/0241578 A1 | 10/2009 | Carlson et al. |
| 2009/0254763 A1 | 10/2009 | Belady et al. |

* cited by examiner

METHOD AND DEVICE FOR REDUCING THE ENERGY CONSUMPTION OF A CENTER COMPRISING ENERGY-INTENSIVE APPARATUSES

The purpose of the invention is to reduce the energy consumption of a center comprising energy-intensive equipment (electronic, computer or telecommunications equipment . . . ), namely the consumption linked to air-conditioning required for operation. Such a center is, for example, a data center, but the invention applies to any other type of center that comprises energy-intensive equipment.

The invention has as its object a data processing center, comprising at least one main room where rows of bays are located, which bays hold a number of functional energy-intensive pieces of equipment that have air intake passages located beside their front surface and air discharge passages located beside their rear surface, and means for cooling by ventilation associated with air intake and discharge passages. The invention also has as its object an air-conditioning process of such a center.

Depending on its importance, such a data processing center occupies one or more rooms and even all of the rooms (computer rooms) of a building. Such a room (referred to below as a "main room") is equipped with furniture forming frames (commonly called "bays" or "racks") on which the containers of electronic, computer or telecommunications gear designed for the operation of different services hosted in the center (such equipment is referred to below as "functional equipment") are installed—carried, attached, . . . , if necessary stacked, superposed . . . . This functional equipment comprises a number of electrical, telecommunications or data transmission connections that are designed to be associated with connections provided in the main room. For example, the bays are wired to make possible the wiring of functional equipment.

The main rooms make it possible to house a large number of functional pieces of equipment on a given floor surface. During operation, these pieces of equipment generate an appreciable amount of heat that has to be evacuated so that the operation is not affected. For this purpose, such a functional piece of equipment is equipped with one or more air intake passages for ventilation located beside one of its surfaces (front surface) and one or more air discharge passages located beside one of its opposite surfaces (rear surface). Such a piece of equipment is equipped with means for cooling by ventilation that are associated with intake and discharge passages, for example, including fans that can, with air passages, run over the equipment tempered ventilation air that cools the equipment or at least discharges the heat that it produces during its operation, the thus heated air then being evacuated.

Typically, such bays measure 19 inches, and they comprise support structures, side panels, and arrangements (drawers, slides, panels, cable guides, front and/or rear doors . . . ) that can make possible the installation (transport, attachment, stacking, superposition), and the wiring. These bays can also be dedicated to a system that is built by the suppliers (large servers, computers, data storage units . . . ) and although identified as "stand-alone"-type equipment are still considered in this application in the same way as the above-mentioned bays.

Most often, the bays comprise air intake passages located beside one of their surfaces (front), and air discharge passages located beside their other surface (rear) and/or beside their upper surface ("roof rack"), if necessary with front and/or rear doors. These bays are placed and structured in such a way that the containers of the equipment form single stacks and single rows that are separated by front and rear aisles, in such a way as to provide access for each container of functional equipment, which is necessary for installing and removing the containers of functional equipment as well as for the electrical, computer or telecommunications connections, for adjustment, monitoring, and ventilation.

The center comprises air-conditioning means that can provide—on the front surfaces of the equipment—filtered air, where said filtered air's flow rate, temperature $T_2$—for example on the order of 21° C.—and hygrometric degree are kept or encompassed within the ranges that are suitable for the optimal operation of the equipment.

In certain embodiments, the bays rest on a raised false floor, providing a space for the passage and distribution of wires and for the circulation and distribution of ventilation air. In other embodiments, this circulation, distribution and passage space is placed in the upper part, in the ceiling.

Historically, the equipment was installed in rooms without concern for the energy impact. The air-conditioning was most often produced by means of reversed-blowing cabinets taking up the ambient air and/or in the false ceiling and blowing fresh air into the raised floor that is put into overpressure. Using perforated plates and/or adjustable grids that are distributed in the room, fresh air was dissipated into the room to maintain an ambient temperature under the above-indicated conditions.

Later, the equipment was installed in rows, in particular according to a repetitive front surface/rear surface—front surface/rear surface structure. The air-conditioning was then produced by means of reversed-blowing cabinets, but this approach found its limits because of the existence of hot points, as a result of the increase in the power of the processing centers.

Later, the equipment was installed back-to-back to form cold passages and hot passages, with all of the front surfaces of the equipment of two rows emerging on either side of a cold passage and all of the rear surfaces emerging on either side of a hot passage. With such an arrangement, it was possible to consider that it was no longer decisive to strive for a mean temperature of 21° C., but to have a temperature kept at 21° C. or 22° C. in the cold passages, while it was possible to agree to have a temperature able to reach 35° C. in the hot passages, based on the characteristics of the installed equipment. It was proposed to improve this arrangement by containing the cold passages by means of doors at the ends of the cold passages and a covering placed above. This arrangement makes it possible to preserve the cold and to prevent its loss.

One of the problems of such centers is the importance of energy consumption that is elevated for a number of reasons. The density of the equipment tends to increase and this equipment is energy-intensive, whereas the computing power demand tends to grow. The optimal operation of the equipment assumes that it is supplied with filtered air, where the filtered air's flow rate, temperature and hygrometric degree are kept or encompassed within suitable ranges. Taking into account the heat that is generated by the equipment during operation, increasingly powerful and increasingly energy-intensive air-conditioning devices have been provided. Thus, it is believed that the primary portion of the total energy consumption of a data center, beyond the energy consumption of computer, electronic and telecommunications equipment, has air-conditioning as its origin.

The GRID GREEN consortium designed an energy performance indicator of the data centers: PUE (Power Usage Effectiveness). This indicator measures the ratio between the total energy expenditure of a data center and that which is unique to its electronic, computer or telecommunications equipment.

The documents US 2009/0254763 and US 2009/0251860 pose the problem of the control of the energy consumption of a data center and describe a data center that comprises resource units that include air intake means and air discharge means and that include a group of data processing modules that comprise the minimum number of components that can carry out the primary functions of these modules, an air circulation system that is configured to receive and provide non-conditioned outside air to the resource units. This air circulation system comprises a ventilation system that is configured to direct hot air that comes from the air exhausts to the air intakes in such a way that with the air intakes, the hot air is mixed with the non-conditioned outside air. In one embodiment, it is provided that the resource units are stacked in the form of a vertical tower rather than juxtaposed. In this case, a shaft is provided for the extraction of hot air by natural draw or by fan-assisted draft.

The approaches proposed by these documents cannot provide satisfaction completely.

The free space around the equipment is too small for the passage of wires and for installing and removing the equipment containers or ensuring the modifications of layout or connection. The proposed arrangement therefore seems to be suitable only with specific equipment, which considerably limits its advantage and scope.

With the arrangement that is described by these documents, fresh air comes in on a first surface of the equipment and then is heated while passing through this equipment and is then discharged from the second surface to be taken up by fans in the upper position. The fresh air that enters into the module that hosts the bays can go along toward the top of the first surface or beside the bays and be mixed with the hot air that is discharged from the second surface. This phenomenon is enhanced because the air passes where the pressure drop is least significant and the fans create a partial vacuum, with a tendency to draw in not only the discharged hot air but also the fresh air. The draft effect is lessened by the fact that the discharged hot air is mixed with fresher, poorly-channeled air. In addition, the draft cannot be termed natural because of the presence of fans. The air that is discharged by the fans is a mixture of hot air and fresh air. Finally, the fans themselves are also energy-intensive.

All this, overall, is detrimental to the effectiveness and the efficiency of the arrangement.

The same holds true because of the obstacles encountered by the air flow, via the raised floor, and then by the air intakes, which increases the pressure drops and makes it necessary to provide more powerful fans, which is a consumer of increased energy and degrades the PUE.

The same holds true in the case where it is provided that the resource units are stacked in the form of a vertical tower, because then the pressure drops are increased and the fans have to operate permanently. Although it is provided in this arrangement that one or more turbines can be mounted in the shaft, this approach is purely theoretical and does not correspond to any actual embodiment.

The same holds true in the case where it is provided to heat the fresh air that is brought in if it is too cold, because then hot air comes in at a reduced volume by the top in such a way that the functional equipment located toward the top receives air that is too hot and the equipment that is located toward the bottom receives air that is too cold, good mixing of the air and adequate monitoring of the temperature of the air sent toward the equipment not being ensured. Furthermore, if the air comes in without treatment, for the equipment located at the base of the bays, it may be at a temperature that is lower than that of the dew point of the ambient air and may create condensation on the bays, or worse yet, within the pieces of equipment under power. Conversely, no approach is proposed if the air is at a temperature that is too high.

The document U.S. Pat. No. 7,529,086 also poses the problem of the a/c and air-conditioning of the data centers and provides that two rows of bays are arranged according to a front surface/rear surface—rear surface/front surface structure. A chamber that comprises a roof and that extends between the two rows of bays ensures the collection of hot air coming from the rear surfaces. This hot air passes through the air-cooling units, with the cooled air being released into the room where the bays are located. The air that is in the chamber is kept at a pressure that is equal to that of the air that is outside of the chamber. It is also provided to bring fresh air to the front surfaces of the bays. This approach comes down to treating by temperature the air in the hot passage for discharging it into the computer room with a suitable temperature. It cannot be considered as being able to provide a contribution to the problem posed because the air-cooling units are energy-intensive and complementary to the a/c cabinets that are usually installed in the rooms and all the more energy-intensive since they have to treat the hotter air if the equipment produces more heat or since they have to treat air whose intake into equipment may not be necessary. Likewise, this approach calls for a permanent operation of the air-cooling units, which represents an additional energy consumption that affects the PUE.

One approach that is close to the preceding one but without a hot containment chamber is described in the document US 2009/0207567 that relates to an arrangement that also operates on the principle of a closed circuit that does not take advantage of the outside air.

The document US 2009/0210096 describes an arrangement in which the rows of bays rest on a raised floor. This arrangement provides for the use of the outside air when its temperature and its moisture level are in accordance with the operational ranges of the equipment. The outside air is taken directly at the air-conditioners. This approach makes it possible not to cool the air over a significant time range but it permanently uses the fan of the air-conditioners with the excessive consumption linked to pressure drops due to the existence of a raised floor, the holding structure, the presence of wires, and pipes that obstruct the space that is found under the raised floor.

It is important to note that the more significant the thermal power to be dissipated is, the bigger the volume of fresh air to be supplied should be. The volume of air that is thus blown into the raised floor, when this approach is used, increases proportionally with the power to be dissipated. The raised floor being produced definitively for putting the data center into operation, the pressure drop that is shown by the raised floor and the wires that are gradually installed there increases with the level of occupation of the data center and the evolution of the thermal power that is to be dissipated, the pressure drop being proportional to the speed of the blown air and the space requirement of the raised floor.

In document DE 20 2004 003309 provides fans that are integrated into bays and functional equipment by being associated with intake and exhaust passages and a shaft that empties into the outside, but a central fan, with the inherent drawbacks, is necessarily provided. This document neither describes nor suggests a mixing room or a communication passage such as the passage that is provided in this invention.

The document US 2008/055848 provides for separating the fans from the equipment to install them at the center of the computer room. Consequently, these fans are not integrated into the bays and functional equipment by being associated with intake and discharge passages. A large fan, with the inherent drawbacks, is also provided. A room that comprises an opening toward the outside is also provided, but this document does not teach making use of the natural ventilation as an essential conditioning means. In addition, this document neither describes nor suggests a communication passage such as that which is provided in this invention nor a shaft for extracting hot air.

These last two documents neither describe nor suggest means of air-conditioning means constituted by the combination of the cooling means by ventilation of the functional equipment and natural convection means with which the center is equipped in such a way that the center may be lacking in fans for extraction of hot air and/or fans for intake of fresh air. They no longer reveal that the air-conditioning means comprise a mixing room that has an outside air intake opening, a communication passage between the mixing room and the main room located outside of the containment chamber, a shaft for extraction of hot air, having an upstream extraction intake that communicates with the containment chamber, and a downstream discharge outlet toward the outside of the main room that operates by natural convection, and thus an open air circuit between, upstream, the intake opening of the outside air and, downstream, the downstream discharge outlet.

The state of the art also comprises the documents US 2009/254763, U.S. Pat. No. 7,430,118, US 2006/0168975, US 2009/0241578 and US 2007/0171613, the embodiment of the Yokohama Third Center of the company Hitachi Data Systems Corporation that makes it possible to attain a PUE of 1.6 by combining a set of means such as an integrated control center, a thermohydraulic simulator that optimizes cooling, a shade-creating terrace garden in which the data processing center is placed . . . .

The problem on which the invention is based is therefore to reduce in a very significant way the energy consumption of a data center and more specially the portion of the energy consumption that is linked to air-conditioning. More specially, the problem is to remove known approaches that involve having raised floors, known approaches that rest on the principle of a closed circuit where hot air is cooled in order to be reinjected or on the principle of an assisted extraction, or to remove approaches that lead to significant pressure drops.

The problem on which the invention is based is to be able to reduce in a very significant way the energy consumption of a data center, namely the one that is linked to the air-conditioning required by its operation, regardless of the electronic, computer or telecommunications equipment, and without having to adapt them and without providing operational constraints contrary to the operation of the center and by complying with—in each country—the rules that are linked to the safety of personnel in the case of a fire evacuation (zones that are too confined, cul de sacs . . . ) for accessibility to the equipment (stacking of modules limiting the accessibility to certain pieces of equipment), fire-break compartmentalization (increase in detection and fire-extinguishing zones), and specific regulations for each country linked to safety in general.

The problem on which the invention is based is to reach these results in an economical way in terms of investment and operation and in a reliable way.

The invention therefore has as its object a data center comprising a main room where rows of bays are located with functional energy-intensive pieces of equipment that have air intake passages located beside their front surface and air discharge passages located beside their rear surface, and means for cooling by ventilation, in which:

The arrangement of the bays and equipment is such that a pair of two adjacent rows, of which the back-to-back surfaces are the rear surfaces, defines a hot passage where the air discharge passages, in which the air is hot, are accessible at a temperature $T_3$ that is higher than the temperature $T_2$ of the tempered air that is in the portion of the main room that is outside of the hot passages and from which the front surfaces and the air intake passages are accessible, Air-conditioning means are provided that can provide filtered air on the front surfaces, where said filtered air's flow rate, temperature $T_2$ and hygrometric degree are kept or encompassed within ranges that are suitable for the optimal operation of the equipment, The hot passages are part of a hot-air containment chamber that is isolated from the portion of the main room that is outside of this chamber.

The means of the air-conditioning means comprise, more particularly substantially comprise, and even more especially consist of, the combination of the ventilation cooling means of the functional equipment and the natural convection means with which the center is equipped.

According to the embodiments, some of the cooling means that are associated with the intake and discharge passages are dynamic means, such as fans, or static means, such as contoured passages that form a Venturi tube.

According to one characteristic, the center lacks hot-air extraction fans and/or fresh-air intake fans.

According to one embodiment, the means of the air-conditioning means comprise, more particularly substantially comprise, and even more especially consist of:

A mixing room that has an outside air intake opening that is suitable for ensuring by natural convection an outside air intake at a variable temperature $T_1$ that is based on climatic conditions, a mixing volume and means that are suitable for producing—in the mixing room—air at the temperature $T_2$, regardless of the temperature $T_1$, by adding a suitable amount of air at a temperature that is higher than $T_1$, or by adding a suitable amount of air at a temperature that is lower than $T_1$, based on air requirements at the temperature $T_2$ of functional equipment that is located in the main room, A communication passage between the mixing room and the main room, suitable for ensuring, by natural convection, the passage of air at temperature $T_2$ that is produced in the mixing room in the portion of the main room that is outside of the hot-air containment chamber, with the communication passage being located outside of the containment chamber, A hot-air extraction shaft, having an upstream extraction intake that communicates with the containment chamber and a downstream discharge outlet toward the outside of the main room, suitable for, by natural convection, extracting hot air at temperature $T_3$ from the containment chamber and discharging it to the outside of the main room, An open air circuit between, upstream, the outside air intake opening, and, downstream, the downstream discharge opening.

According to the embodiments, a communication passage is made in a ceiling or in a wall of the main room outside of the shaft and/or made in a floor and/or a wall of the mixing room.

According to the embodiments, the mixing room is located close to, more particularly contiguous to, the main room, for example above or beside the main room. Thus, in one embodiment, the communication passage is made in a ceiling of the main room outside of the shaft and in a floor of the mixing room. And, the mixing room is located above, more particularly contiguous to, the main room. In another embodiment, the communication passage is made in a wall of the main room outside of the shaft and in a wall of the mixing room. And, the mixing room is located beside, more particularly contiguous to, the main room.

According to one characteristic, the communication passage is not made in the floor or the raised floor of the main room. Thus, if the center comprises a raised floor and a space under the raised floor, it is not arranged to include a communication passage and to distribute air at temperature $T_2$ into the main room, and this space under the raised floor is not arranged for the circulation of the air that is provided by the air-conditioning means.

According to one embodiment, the means for producing—in the mixing room—air at the temperature $T_2$ by adding air at a higher temperature to the air at temperature $T_1$ comprise, more particularly substantially comprise, and even more especially consist of, a hot-air valve that is associated with the shaft, the hot-air valve being located in the mixing room, with the opening and the closing of the hot-air valve being controlled by heat regulation means associated with means for measuring the temperature of the air.

According to another embodiment, the means for producing—in the mixing room—air at the temperature $T_2$ by adding air at a higher temperature to the air at temperature $T_1$ comprise, more particularly substantially comprise, and even more especially consist of, a hot-air valve that is associated with the shaft, the hot-air valve being located in the main room, with the opening and the closing of the hot-air valve being controlled by heat regulation means associated with means for measuring air temperature.

According to one embodiment, the pipe of the shaft passes through the mixing room and comprises a heat insulation fixture.

According to one embodiment, the means for producing—in the mixing room—air at the temperature $T_2$ by adding air at a lower temperature to the air at temperature $T_1$ comprise, more particularly substantially comprise, and even more especially consist of, an air-conditioner, located in the mixing room, the operation of the air-conditioner being controlled by heat regulation means associated with means for measuring air temperature.

According to one characteristic, the mixing room has dimensions and a mixing capacity and the opening has dimensions that are determined to make it possible, based on the air flow at temperature $T_1$ and the air flow at a higher or lower temperature, to produce an air mixture flow at temperature $T_2$ that is suitable for the estimated or desired maximum air flow at temperature $T_2$ for supplying the main room.

According to one embodiment, the means of the air-conditioning means that with functional equipment can provide air, where said air's hygrometric degree is kept within the suitable range, comprise, more particularly substantially comprise, and even more especially consist of, humidifying/dehumidifying means for producing air to the desired hygrometric degree in the mixing room and/or in the main room by adding humidified air or by adding dehumidified air, with the humidifying/dehumidifying means being controlled by hygrometric regulation means that are associated with means for measuring the hygrometry of the air.

According to one embodiment, the hot-air extraction shaft comprises a downstream discharge outlet that is located outside of the center.

According to one embodiment, the center also comprises means for assisting natural convection that are associated with the shaft that can comprise:
  The shaft that comprises two separate, distinct segments:
    An upstream segment that has the upstream extraction intake and an intermediate downstream outlet,
    A downstream segment that has an intermediate upstream intake and the downstream discharge outlet,
  A hot mixing room that is suitable so that the air that is located therein is at a temperature $T_4$, higher than temperature $T_3$, the hot mixing room being placed between the two segments that are upstream and downstream from the shaft and in which the intermediate downstream outlet and the intermediate upstream intake are located and into which they empty.

According to the embodiments, this hot mixing room is closed except for the intermediate downstream outlet and the intermediate upstream intake, and means that can raise the temperature from $T_3$ to $T_4$, in particular static means, are associated with this hot mixing room. In one embodiment, these static means comprise heating means of solar origin, and, for example, comprise one or more glass walls or the like on one or more walls and/or the ceiling cover of the hot mixing room, which thus forms a canopy that is heated by the sun. According to another embodiment, the means for assisting natural convection are a static intake device that is mounted on the downstream discharge outlet of the shaft.

According to one embodiment, the center also comprises a device for recovery of the energy of the hot air that is extracted by the shaft, for example placed at least partly in the pipe of the shaft, toward the downstream discharge outlet and/or toward the intermediate downstream outlet.

According to one embodiment, the containment chamber is closed above the hot passage by the extraction shaft that forms a collector, comprising an upstream extraction intake, and it is closed at its two ends, with the provision of at least one door and, if necessary, it is closed between functional equipment that is installed when one or more pieces of other equipment are not yet installed between them, with the provision of at least one plastron.

According to the embodiments, the shaft has an inside cross-section whose surface area is the largest toward the upstream extraction intake and whose surface area is the smallest toward the downstream discharge outlet.

According to the embodiments, the air intake opening that is outside of the mixing room is equipped with at least one filter that is adapted to the quality of air that is required for the main room, in particular oversized for reducing the pressure drop provided.

The invention also has as its object an air-conditioning process of a data center, as disclosed above, in which, to ensure a flow rate within the range of flow rates that is suitable for the optimal operation, there is used, more particularly substantially used, even more especially used exclusively, in combination, ventilation cooling means of functional equipment and natural convection means with which the center is equipped.

According to one embodiment:

Outside air at temperature $T_1$ is brought into the mixing room by natural convection, In the mixing room, the outside air that is thus brought in is mixed with a suitable amount of air at a temperature that is higher than $T_1$ or with a suitable amount of air at a temperature that is lower than $T_1$, and air is thus produced at the temperature $T_2$, Air at the temperature $T_2$ is brought from the mixing room to the portion of the main room that is outside of the containment chamber, Hot air is extracted from the containment chamber by natural convection, The extracted air is discharged, And thus an open air circuit is produced between the intake of the air from the mixing room and the discharge of the air that is extracted via the air passage openings of the front surfaces and the rear surfaces of the functional equipment.

According to one embodiment, the air at the temperature $T_2$ is brought from the mixing room to the portion of the main room that is outside of the containment chamber by a generally downward movement and/or a generally horizontal movement, respectively by a movement unlike a generally upward movement from the floor or the raised floor of the main room.

According to one embodiment, to mix the outside air that is brought into the mixing room with a suitable amount of air at a temperature that is higher than $T_1$, a suitable amount of hot air that is extracted from the containment chamber by natural convection is sampled.

According to one embodiment, the natural convection in the hot-air extraction shaft is assisted statically. For this purpose, according to one embodiment:

Hot air is brought from the containment chamber by natural convection by a segment that is upstream from the shaft, from the upstream extraction intake up to an intermediate downstream outlet, The air that is located in the hot mixing room, in which the intermediate downstream outlet and an intermediate upstream intake of a segment that is downstream from the shaft, having the downstream discharge outlet, are located and into which they empty, is brought in at a temperature $T_4$ that is higher than the temperature $T_3$, The hot air is extracted from the hot mixing room by natural convection, The air that is extracted by the downstream segment of the hot-air extraction shaft is discharged from the intermediate upstream intake up to a downstream discharge outlet.

According to one embodiment, the energy from the hot air that is extracted by the shaft is recovered.

Several embodiments of the invention will now be described using the drawings, in which.

The invention relates to a center 1 that comprises energy-intensive equipment 2, such as electronic, computer or telecommunications equipment. Such a center is, for example, a data center, but the invention applies to any other type of center that comprises energy-intensive equipment 2.

The invention has more specially as its object the center 1 itself and the air-conditioning process of such a center. The invention makes it possible to reduce the energy consumption that is linked to the air-conditioning required by the operation of such a center 1.

A center 1 may comprise one or more main rooms 4, such as computer rooms.

Such a main room 4 is limited by a floor 4a and most often a raised floor 4b that is placed above, with a space 4c, walls or partitions 5, and a ceiling 6 between them. It forms and bounds an inside space 7.

Figure 1:
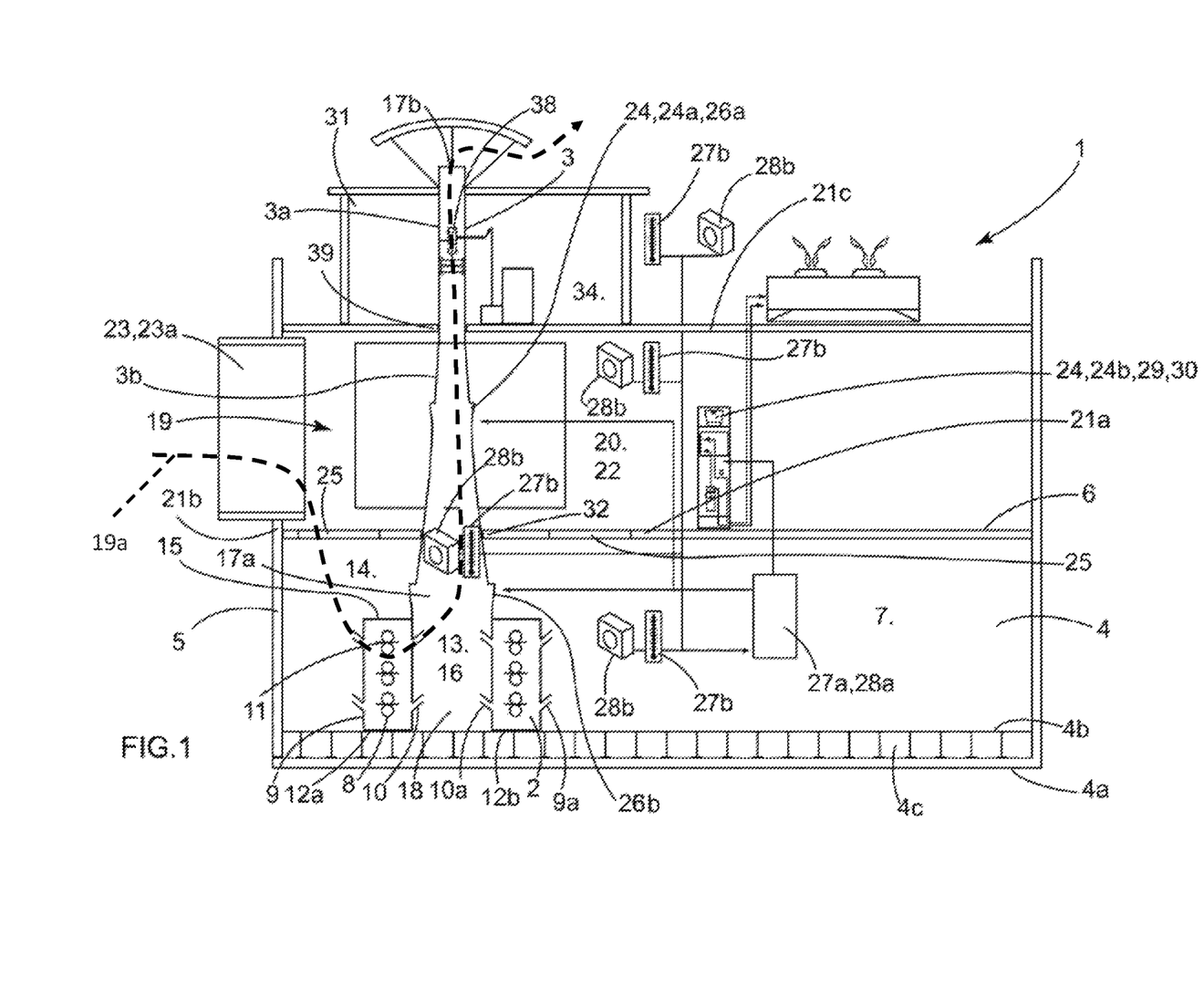
FIG. 1 is a diagrammatic cutaway view through a vertical plane of a data processing center according to the invention according to a possible embodiment, with this diagrammatic view also illustrating a shaft that comes into the embodiment of such a center and the air-conditioning process of a center.
Figure 2:
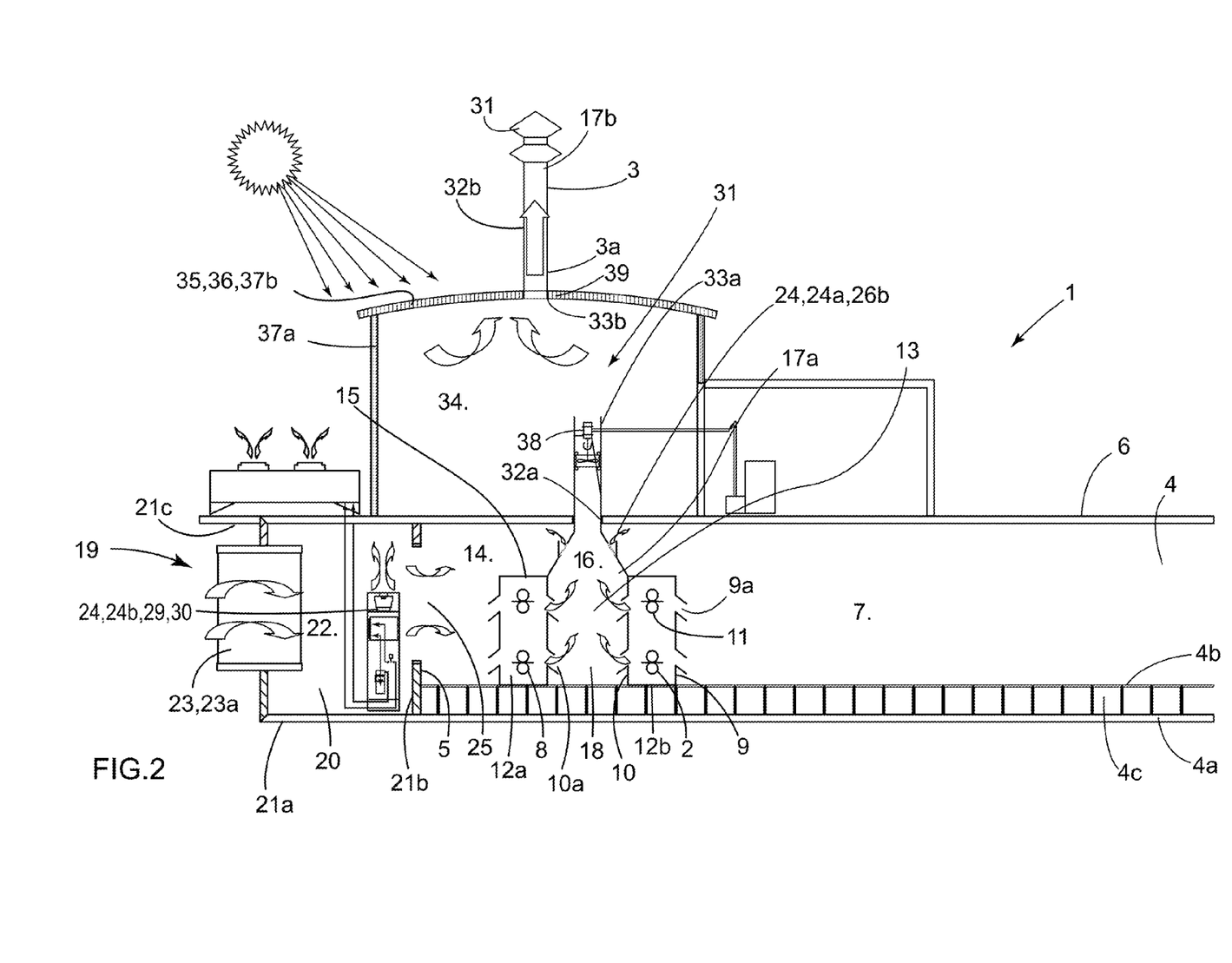
FIG. 2 is a diagrammatic cutaway view through a vertical plane of a data processing center according to the invention according to another possible embodiment.

Arranged in this space 7 and resting on the raised floor 4b, there are several rows of bays 8 on which the energy-intensive functional equipment 2 is installed, most often quite a number of pieces of hardware. In the embodiments that are illustrated by the figures, two blocks that symbolize two rows of bays 8 and equipment 2 are shown diagrammatically.

For example, in the case of a data center 1, this equipment 2 is electronic, computer, or telecommunications equipment.

A row of bays 8 and equipment 2 has a front surface 9 on one side and a rear surface 10 on the opposite side.

Air intake passages 9a are located functionally beside the front surface 9. Air discharge passages 10a are located beside the rear surface 10.

The bays 8, the equipment 2, comprise ventilation cooling means 11 that are associated with the intake and discharge passages 9a, 10a, shown in a symbolic way. Typically, these means 11 are of the dynamic type, such as fans that are integrated with bays 8, with equipment 2, or of the static type, such as contoured passages that form Venturi tubes.

According to a known arrangement, two adjacent rows 12a, 12b of bays 8 and equipment 2 are parallel to one another, and their back-to-back surfaces are the rear surfaces 10. Such an arrangement makes it possible to define a passage 13, limited by the rear surfaces 10 opposite. Most often, several hot passages 13 are provided, in particular arranged parallel.

The passage 13 is described as hot because the temperature of the air that is found therein—$T_3$—is higher than the temperature—$T_2$—of the tempered air that is in the portion 14 of the main room 4 that is outside of the hot passages 13.

The portion 14 forms a space that is outside of the bays 8 and equipment 2 in which the air at temperature—$T_2$—can be found and can circulate. This portion 14 is located before the front surfaces 9 and the air intake passages 9a from which they are thus respectively accessible and empty into the portion 14. This portion 14 is also located above the bays 8 whose upper surfaces (or roofs) 15 are moved apart below the ceiling 6.

On their part, the rear surfaces 10 are located in and accessible through the hot passages 13 where the air discharge passages 10a empty.

The hot passages 13 are part of one or more hot-air containment chambers 16, isolated from the portion 14, which is outside of this or these containment chamber(s) 16.

On the one hand, a hot-air extraction shaft 3 has an upstream extraction intake 17a that communicates with a containment chamber 16. On the other hand, it has a downstream discharge outlet 17b for discharging the air that comes from the shaft 3 toward the outside of the main room 4. This downstream discharge outlet 17b is located outside of the center 1, for example at the top part in a cleared zone so as not to impede the discharge.

The containment chamber 16 is closed above the hot passage 13 by the hot-air extraction shaft 3 that in this zone forms a collector that comprises the upstream extraction intake 17a.

The containment chamber 16 is closed at each of its two ends, with the provision of a door 18 that is located at each of the ends of the rows of bays 8. When the center 1 is operating, the doors 18 are normally closed. They are opened temporarily to allow entry into or discharge from the corresponding hot passage 13 when it is necessary to access the rear surfaces 10 of the equipment 2 that is found therein.

The containment chamber 16 is also closed, if necessary, between pieces of equipment 2 that are installed when one or more other pieces of equipment 2 are not yet installed between them, with the provision of at least one plastron, for example placed on the front surface 9.

The center 1 also comprises air-conditioning means that have as their function, for technical requirements, to modify, monitor and regulate the climatic conditions of the atmospheric air of the main rooms 4. More specifically, these air-conditioning means are selected, computed, arranged, controlled and regulated in such a way as to provide filtered air on the front surfaces 9 and air intake passages 9a of the equipment 2, where said filtered air's flow rate, temperature $T_2$ and hygrometric degree are kept or encompassed within the ranges of flow rates, temperatures and hygrometric degrees that are suitable for the optimal operation of the equipment 2. Actually, it is established that the conditioning of the ambient air of the equipment 2 of the data centers is a decisive key factor for the optimal operation of this equipment 2 and therefore the data center 1 itself. For example, the requested range of temperatures $T_2$ is on the order of 21° C., able to have low tolerances of +/−1° C. or higher tolerances based on the specificities of the equipment 2, and the relative humidity is to be on the order of 50% to 60% or 35-70, also according to the situations.

The means of the air-conditioning means that can provide air to the equipment 2, where said air's flow rate is kept within the range of suitable flow rates, consist of the combination of cooling means 11 and natural convection means 19 with which the center 1 is equipped. With such an embodiment, the center 1 may be lacking in hot-air extraction fans and/or fresh-air intake fans other than those with which the equipment 2 is optionally equipped. Under the optimal operating conditions, the means of the air-conditioning means substantially only comprise the combination of means 11 and 19.

The air-conditioning means comprise one or more air-mixing rooms 20.

Such a mixing room 20 is limited by a floor 21a, walls or partitions 21b and a ceiling 21c. It shapes and bounds an inside space 22.

The mixing room 20 comprises one or more outside air intake openings 23, for example made in its walls or partitions 21b. These openings 23 have large dimensions, in such a way as not to impede the outside air intake. These openings 23 are equipped with filters 23a that are suitable for the air quality that is required for the main room 4. These filters 23a are themselves also oversized for reducing the pressure drop that they cause and therefore do not impede the outside air intake, by natural convection.

The openings 23 are suitable and have as their function to ensure by natural convection—and only by this means—an outside air intake with variable temperature $T_1$ in the mixing room 20.

The temperature $T_1$ is, of course, based on the climatic conditions outside of the center 1.

The inside space 22 of the mixing room 20 constitutes an air mixture volume.

In addition, means 24 are provided that are suitable for producing air at the temperature $T_2$, regardless of the temperature $T_1$, in the mixing room 20. For this purpose, in the mixing room, a suitable amount of air is added at a temperature that is higher than the temperature $T_1$ or at a temperature that is lower than the temperature $T_1$. This addition of air is controlled and regulated based on the air requirements at the temperature $T_2$ of the equipment 2 that is in the main room 4.

The mixing room 20 has dimensions and a mixing capacity, and, in contrast, the openings 23 have dimensions that are determined in such a way as to make it possible, based on the air flow brought in at the temperature $T_1$ and the air flow that is added at a temperature that is higher than or lower than $T_1$, to produce an air mixture flow at temperature $T_2$, which is that which is suitable for the estimated or desired maximum air flow at temperature $T_2$ for supplying the at least one main room 4.

One or more communication passages 25 are made between the mixing room(s) 20 and the main room(s) 4.

These communication passages 25 are adapted and have as their function to ensure by natural convection—and only by this means—the passage of air at temperature $T_2$ that is produced in the mixing room 20 in the portion 14 of the main room 4. For this purpose, the communication passages 25 are located outside of the containment chamber(s) 16.

The mixing room is closed, except for the openings 23, passages 25 and openings, vents or the like forming part of the means 24 for producing air in the mixing room 20 at the temperature $T_2$.

The shaft(s) 3 are adapted and have as their function to ensure by natural convection—and only by this means—the extraction of hot air at temperature $T_3$ from the containment chamber(s) 16, and then to discharge it outside of the main room 4 and the outside of the center 1.

With the preceding arrangements, an open air circuit 19a is created between, upstream, the outside air intake opening(s) 23, and, downstream, the downstream discharge outlet(s) 17b.

The respective arrangement of the main room 4, the mixing room 20, openings 23 and passages 25 can be the object of several embodiments. For example, on the one hand, as appropriate, a communication passage 25 is made in the ceiling 6 (FIG. 1) or in a wall 5 (FIG. 2) of a main room 4, outside of any shaft 3. On the other hand, as appropriate, a communication passage 25 is made in a floor 21a (FIG. 1) or in a wall 21b (FIG. 2) of a mixing room 20.

Preferably, a mixing room 20 is located close to a main room 4. More specifically, a mixing room 20 is contiguous to a main room 4.

As appropriate, a mixing room 20 is located above (FIG. 1) or beside (FIG. 2) a main room 4. Thus, in the case of FIG. 1, the communication passage 25 is made, on the one hand, in the ceiling 6 of the main room 4, and, on the other hand, in the floor 21a of the mixing room 20, with the mixing room 20 being located above, and more particularly just above, the main room 4. The pipe 3a of the shaft 3 then passes through the mixing room 20, and it comprises a heat insulation fixture 3b.

In the case of FIG. 2, the communication passage 25 is made, on the one hand, in a wall 5 of the main room 4, and, on the other hand, in a wall 21b of the mixing room 20, with the mixing room 20 being located beside, and more particularly just beside, the main room 4.

The means 24 for producing air in the mixing room 20 at the temperature $T_2$, regardless of the temperature $T_1$, by adding air at a temperature that is higher than or lower than the temperature $T_1$, will now be described.

In one embodiment, the means 24a for producing air at the temperature $T_2$ by adding air at a temperature that is higher than $T_1$ comprise one or more hot-air valves 26a that are associated with the shaft 3. One or more such hot-air valves 26a are located in the mixing room 20. The opening and the closing of the hot-air valves 26a are controlled by heat regulation means 27a that are associated with the means for measuring the temperature of the air 28a.

In one embodiment, the means 24a substantially comprise only—and even more particularly consist of—the hot-air valves 26a in question and the means 27a and 28a.

In another possible embodiment, the means 24a comprise—or substantially comprise only and even more particularly consist of—hot-air valves 26b that are also associated with the hot-air extraction shaft 3, but are located within the main room 4, in its portion 14.

As above, the opening and the closing of these hot-air valves 26b are controlled by the heat regulation means 27a that are associated with air temperature measuring means 28a.

In another possible embodiment, the means 24a substantially comprise—and more particularly consist of—the hot-air valves 26a that are located in the mixing room 20 and the hot-air valves 26b that are located in the main room 4, with the associated means 27a and 28a.

The means 24b for producing air at the temperature $T_2$ by adding air at a temperature that is lower than $T_1$ comprise one or more air-conditioners 29, located in one of the—or in the—mixing rooms 20.

The operation of the air-conditioners 24b is controlled by the heat regulation means 27a associated with the air-temperature measuring means 28a.

In one embodiment, the means 24b substantially comprise only—and even more particularly consist of—the air-conditioner 29 in question and the means 27a and 28a.

The means of the air-conditioning means that can provide air to the functional equipment, where said air's hygrometric degree is kept within the suitable range, comprise humidifying/dehumidifying means 30 such that they produce air in the mixing room 20, alternately or cumulatively in the main room, to the desired hygrometric degree. For this purpose, they add humidified air or dehumidified air to the air flow brought in through the openings 23, based on the relative humidity of the latter and the relative humidity that is desired for the air that is directed toward the portion 14 of the main room 4. These humidifying/dehumidifying means 30 can be coupled to, associated with, or integrated into the air-conditioner 29. The operation of the humidifying/dehumidifying means 30 is controlled by hygrometric regulation means 27b associated with air hygrometry measuring means 28b.

The heat regulation means 27a can be combined with hygrometric regulation means 27b in a control box.

The air temperature measuring means 28a can be associated with air hygrometry measuring means 28b in a measuring unit.

According to one development (FIG. 2), the center 1 also comprises means 31 for assisting natural convection that are functionally and structurally associated with the hot-air extraction shaft 3.

In the embodiment of FIG. 1, the means 31 for assisting natural convection are a static or stato-dynamic intake device that is mounted on the downstream discharge outlet 17b of the shaft 3. Static device means a device that does not comprise any moving part and does not consume energy produced for this purpose. Such a device can consist of, for example, contoured passages that form Venturi tubes. Statodynamic device means a device that comprises one or more moving parts under the action of aeraulic conditions (wind, pressure . . . ), but does not consume energy produced for this purpose. Such a device can consist of, for example, a turbine.

Reference is now made to FIG. 2 that illustrates another possible embodiment of the means 31 for assisting natural convection. In this embodiment, the means 31 comprise the shaft 3 that comprises two separate, distinct segments, namely an upstream segment 32a and a downstream segment 32b. The upstream segment 32a comprises the upstream extraction intake 17a and an intermediate downstream outlet 33a. The downstream segment 32b comprises an intermediate upstream intake 33b and the downstream discharge outlet 17b. Preferably, the two segments 32a and 32b are moved apart axially in such a way that the air that exits from the intermediate downstream outlet 33a is effectively mixed with the air of the hot mixing room 34 before entering into the intermediate upstream intake 33b. In the embodiment that is being considered, the means 31 also comprise one or more hot-air mixing rooms 34. Such a room 34 is adapted so that the air that is located therein is at a temperature $T_4$, higher than temperature $T_3$. In addition, such a room 34 is arranged with the shaft 3 in two segments 32a and 32b in such a way as to be inserted between these two segments 32a and 32b. Thus, the intermediate downstream outlet 33a and the intermediate upstream intake 33b are located in and empty into the room 34, which is closed except for the intermediate downstream outlet 33a and the intermediate upstream intake 33b.

The means 31 also comprise, associated with the hot mixing room 34, means 35 that can raise the temperature of the air that is in the room 34 from $T_3$ to $T_4$. In the embodiment of FIG. 2, these means 35 are static and, for example, comprise or consist of heating means of solar origin. For this purpose, for example, one or more glass walls or the like 36 are provided on the walls 37a or the ceiling cover 37b of a hot room 34. Thus, such a room 34 forms a type of canopy that is heated by the sun, which makes it possible to heat the air that is found therein. As a result, the natural convection that already existed in the absence of means 31 is aided, assisted and reinforced by the presence of these means.

Of course, it is possible to combine the means 31 for assisting natural convection of the static or stato-dynamic intake type according to the embodiment of FIG. 1 and the heating means 31 of solar origin according to the embodiment of FIG. 2.

A hot mixing room 34 is preferably located high up, for example above a mixing room 20 (FIG. 1) or above a main room 4 (FIG. 2).

According to another development, the center 1 also comprises one or more devices for recovery of the energy 38 of the hot air that is extracted by the shaft 3, for example placed at least in part in the pipe 3a of the shaft 3. In the embodiment of FIG. 1, the device 38 is placed toward the downstream discharge outlet 17b. More specially, it may be located at the level of a hot mixing room 34. In the embodiment of FIG. 2, the device 38 is placed toward the intermediate downstream outlet 33a. As above, it may be located at the level of a hot mixing room 34. Such a device 38 is, for example, of the type that comprises blades driven in rotation by the air flow, mounted on a rotor of an electrical current generator.

The shaft 3 is arranged to maximize the desired natural convection. The length and the cross-section of the pipe 3a are determined as a result. In particular, in the embodiments of FIGS. 1 and 2, the pipe 3a has an inside cross-section whose surface area is the largest toward the upstream extraction intake 17a and whose surface area is the smallest toward the downstream discharge outlet 17b.

According to the embodiments, the shaft 3 comprises one or more valves 26a, one or more valves 26b, and one or more valves 26a and 26b.

Such a shaft 3 also comprises means 39 for attachment to the containment chamber 16, the ceiling 6, the floor 21a, the ceiling 21c, or the ceiling 37b.

As indicated, the pipe 3a of the shaft 3 advantageously comprises a heat insulation fixture 3b, primarily if the shaft 3 passes through the mixing room 20.

As indicated, in one possible embodiment, the shaft 3 comprises two separate, distinct segments, an upstream segment 32a, and a downstream segment 32b.

The process for conditioning air from the center 1 is inferred from the very structure of the center.

In addition, the outside air at temperature T1 is brought to a mixing room 20 by natural convection, the outside air that is thus brought in is mixed with a suitable amount of air at a temperature that is higher than T1 or with a suitable amount of air at a temperature that is lower than T1, and the air is thus produced at the temperature T2; the air at the temperature T2 is brought from the mixing room 20 into the portion 14 of a main room 4; the hot air is extracted from the containment chamber 16 by natural convection, and the extracted hot air is discharged. By so doing, an open air circuit 19a is produced between the air intake opening 23, and the downstream discharge outlet of the hot air 17b, via the air intake passages 9a and the air discharge passages 10a, and the cooling means 11.

As appropriate, the air at the temperature $T_2$ is brought from the mixing room 20 to the portion 14 of the main room 4 by a generally downward movement and/or a generally horizontal movement, in any case a movement other than a generally upward movement from the floor 4a or the raised floor 4b of the main room 4.

According to one embodiment, to mix the outside air that is brought into the mixing room 20 with a suitable amount of air at a temperature that is higher than $T_1$, a suitable amount of hot air that is extracted from a containment chamber 16 by natural convection is sampled.

If necessary, natural convection is assisted statically in the shaft 3.

If necessary, the hot air is brought from a containment chamber 16 by natural convection by a segment 32a that is upstream from a shaft 3; the air that is located in a hot mixing room 34 is brought to a temperature $T_4$, higher than the temperature $T_3$; the hot air is extracted from the hot mixing room 34 by natural convection, and the air that is extracted by the downstream segment 32b of the shaft 3 is discharged.

If necessary, the energy of the hot air that is extracted by a shaft 3 is recovered.

The invention claimed is:

1. A center (1), such as a data processing center (1), comprising:
at least one main room (4);
rows of bays (8) located in the at least one main room (4), which bays include a front surface (9) and an opposite, rear surface (10), the rows of the bays being arranged to provide at least one pair of two adjacent rows (12a, 12b) of the bays (8);
a mixing room (20) with an outside air intake opening (23) that, by natural convection, provides outside air to the mixing room (20) at variable temperature T1 based on outside climatic conditions;
temperature adjusting means (24) that adjusts the outside air at the temperature T1 to become temperate air at a temperature T2;
natural convection means (19) located within the at least one main room (4) i) receiving the temperate air at the temperature T2 from the mixing room (20) and providing a portion (14) of the at least one main room (4) with filtered temperate air at the temperature T2 and ii) extracting heated air from the rows of bays (8), the natural convection means (19) being free of any hot-air extraction fans and free of any fresh-air intake fans,
wherein the bays hold functional equipment (2), the functional equipment (2) having a front surface and a rear surface,
the bays having air intake passages (9a) located functionally beside the front surface (9) of each bay and air discharge passages (10a) located beside the rear surface (10) of each bay, the front surface (9) of the bays having access to the temperate air from the portion (14) of the at least one main room (4) via the air intake passages (9a),
the functional equipment (2) including ventilation means (11) comprising fans that, via the air intake passages (9a), draw in the temperate air from the portion (14) of the at least one main room (4), run the temperate air over the functional equipment to cool the functional equipment and heat the temperate air, and discharge the thus heated air via the air discharge passages (10a);
a hot air containment chamber (16) comprised of a hot passage (13) located between the at least one pair of two adjacent rows (12a, 12b) of the bays (8) and the functional equipment (2) located within the at least one pair of two adjacent rows (12a, 12b) of the bays (8), wherein the rear surfaces (10) of the at least one pair of two adjacent rows (12a, 12b) of the bays (8) are positioned facing each other in a back-to-back relationship and the rear surfaces of the functional equipment (2) are positioned facing the rear surfaces (10) of the at least one pair of two adjacent rows (12a, 12b) of the bays (8),
the hot passage (13) being isolated from the portion (14) of the at least one room (4) having the temperate air, the hot passage (13) having heated air at a temperature $T_3$ that is higher than the temperature $T_2$ of the tempered air in the portion (14) of the at least one main room (4),
the natural convection means (19) including:
at least one communication passage (25) between the mixing room (20) and the at least one main room (4), the at least one communication passage (25) allowing passage of the temperate air produced in the mixing room (20) into the portion (14) of the at least one main room (4), wherein the portion (14) of the at least one main room (4) is outside of the hot-air containment chamber (16) and the at least one communication passage (25) is located outside of the hot air containment chamber (16), the at least one air communication passage (25) being located outside of the hot air containment chamber (16);
a hot-air extraction shaft (3) having i) an upstream extraction intake (17a) that communicates with an outlet of the hot air containment chamber (16) and ii) a downstream discharge outlet (17b) that discharges outside of the at least one main room (4), and by natural convection, extracts the hot air from the hot air containment chamber (16) and discharging the extracted hot air outside of the at least one main room (4); and an open air circuit upstream of the outside air intake opening (23) and downstream of the downstream discharge outlet (17b), wherein cooling of the function equipment is exclusively performed by a combination of the ventilation means (11) of the functional equipment (2) and the natural convection means (19) without use of any hot-air extraction fans and fresh-air intake fans outside of the bays (8).

2. The center (1) according to claim 1, wherein the at least one communication passage (25) is made in one of the group consisting of a ceiling (6) of the at least one main room (4), a wall (5) of the at least one main room (4) outside of the hot-air extraction shaft (3), a floor (21a) of the at least one main room (4), and a wall (21b) of the mixing room (20).

3. The center (1) according to claim 1, wherein the mixing room (20) is located contiguous to the at least one main room (4).

4. The center (1) according to claim 1, wherein the at least one communication passage (25) is made in a ceiling (6) of the at least one main room (4) outside of the at least one hot-air extraction shaft (3) and, in a floor (21a) of the at least one mixing room (20), and wherein the mixing room (20) is located above, contiguous to the at least one main room (4).

5. The center (1) according to claim 1, wherein the at least one communication passage (25) is made in a wall (5) of the at least one main room (4) outside of the at least one hot-air extraction shaft (3), and in a wall (21b) of the at least one mixing room (20), and wherein the mixing room (20) is located beside, contiguous to, the at least one main room (4).

6. The center (1) according to claim 1, wherein the at least one communication passage (25) is made outside of the floor (4a) or a raised floor (4b) of the at least one main room (4).

7. The center (1) according to claim 6, further comprising at least one device for recovery of energy (38) from the hot air that is extracted by the hot-air extraction shaft (3), the at least one device for recovery of energy (38) being placed at least in part in a pipe (3a), toward the downstream discharge outlet (17b) of the hot-air extraction shaft (3).

8. The center (1) according to claim 6, further comprising a raised floor (4b) and a space (4c) with circulation of the air that is provided by the at least one communication passage (25) means being arranged outside of the space (4c) under the raised floor (4b).

9. The center (1) according to claim 1, wherein the temperature adjusting means (24) comprise at least one hot-air valve (26a, 26b) that is associated with the hot-air extraction shaft (3) with the opening and the closing of the at least one hot-air valve (26a, 26b) being controlled by heat regulation means (27a) that are associated with an air-temperature measuring means (28a).

10. The center (1) according to claim 1, wherein the temperature adjusting means comprise at least one air-conditioner, located in the at least one mixing room (20), with operation of the at least one air-conditioner being controlled by heat regulation means (27a) that are associated with an air temperature measuring means (28a).

11. The center (1) according to claim 1, wherein the mixing room (20) has dimensions and a mixing capacity and the outside air intake opening (23) has dimensions that produce an air mixture flow at temperature $T_2$ suitable for air flow at the temperature $T_2$ for supplying the at least one main room (4).

12. The center (1) according to claim 1, wherein further comprising means (31) for assisting natural convection that are functionally and structurally associated with the hot-air extraction shaft (3).

13. The center (1) according to claim 12, wherein the hot-air extraction shaft (3) comprises two separate, distinct segments:
at least one upstream segment (32a) that has the upstream extraction intake and an intermediate downstream outlet,
at least one downstream segment (32b) that has an intermediate upstream intake (33b) and the downstream discharge outlet (17b),
and further comprising a hot the mixing room (34) that is adapted so that the air that is located therein is at a temperature $T_4$, higher than the temperature $T_3$, the mixing room (34) being placed between the two segments (32a, 32b) that are upstream and downstream from the at least one hot-air extraction shaft (3) and in which the intermediate downstream outlet (33a) and the intermediate upstream intake (33b) of the at least one hot-air extraction shaft (3) are located and into which they empty.

14. The center (1) according to claim 13, wherein the hot mixing room (34) is closed except for the intermediate downstream outlet (33a) and the intermediate upstream intake (33b).

15. The center (1) according to claim 13, further comprising means (35) to raise the temperature from $T_3$ to $T_4$ within the hot mixing room (34).

16. The center (1) according to claim 15, wherein the means (35) that raise the temperature from $T_3$ to $T_4$ are static means or comprise heating means of solar origin.

17. The center (1) according to claim 16, wherein the static heating means of solar origin (35) comprise one or more glass walls (36) on one or more walls (37a) and/or ceiling cover (37b) of the hot mixing room (34), with said hot mixing room (34) thus forming a canopy that is heated by the sun.

18. The center (1) according to claim 1, wherein the hot air containment chamber (16) is closed above the at least one hot passage (13) and at two ends, with provision of at least one door (18).

19. An air-conditioning process for air-conditioning a center (1) comprising at least one main room (4); rows of bays (8) located in the at least one main room (4), which bays include a front surface (9) and an opposite, rear surface (10), the rows of the bays being arranged to provide at least one pair of two adjacent rows (12a, 12b) of the bays (8); a mixing room (20) with an outside air intake opening (23) that, by natural convection, provides outside air to the mixing room (20) at variable temperature T1 based on outside climatic conditions;

temperature adjusting means (24) that adjusts the outside air at the temperature T1 to become temperate air at a temperature T2; a natural convection means (19) located within the at least one main room (4), the natural convection means (19) i) receiving the temperate air at the temperature T2 from the mixing room (20) and providing a portion (14) of the at least one main room (4) with filtered temperate air at the temperature T2 and ii) extracting heated air from the rows of bays (8), the natural convection means (19) being free of any hot-air extraction fans and free of any fresh-air intake fans, wherein the bays hold functional equipment (2), the functional equipment (2) having a front surface and a rear surface, the bays having air intake passages (9a) located functionally beside the front surface (9) of each bay and air discharge passages (10a) located beside the rear surface (10) of each bay, the front surface (9) of the bays having access to the temperate air from the portion (14) of the at least one main room (4) via the air intake passages (9a), the functional equipment (2) including ventilation means (11) comprising fans that, via the air intake passages (9a), draw in the temperate air from the portion (14) of the at least one main room (4), run the temperate air over the functional equipment to cool the functional equipment and heat the temperate air, and discharge the thus heated air via the air discharge passages (10a); a hot air containment chamber (16) comprised of a hot passage (13) located between the at least one pair of two adjacent rows (12a, 12b) of the bays (8) and the functional equipment (2) located within the at least one pair of two adjacent rows (12a, 12b) of the bays (8), wherein the rear surfaces (10) of the at least one pair of two adjacent rows (12a, 12b) of the bays (8) are positioned facing each other in a back-to-back relationship and the rear surfaces of the functional equipment (2) are positioned facing the rear surfaces (10) of the at least one pair of two adjacent rows (12a, 12b) of the bays (8), the hot passage (13) being isolated from the portion (14) of the at least one room (4) having the temperate air, the hot passage (13) having heated air at a temperature $T_3$ that is higher than the temperature $T_2$ of the tempered air in the portion (14) of the at least one main room (4), the natural convection means (19) including:

at least one communication passage (25) between the mixing room (20) and the at least one main room (4), the at least one communication passage (25) allowing passage of the temperate air produced in the mixing room (20) into the portion (14) of the at least one main room (4), wherein the portion (14) of the at least one main room (4) is outside of the hot-air containment chamber (16) and the at least one communication passage (25) is located outside of the hot air containment chamber (16), the at least one air communication passage (25) being located outside of the hot air containment chamber (16);

a hot-air extraction shaft (3) having i) an upstream extraction intake (17a) that communicates with an outlet of the hot air containment chamber (16) and ii) a downstream discharge outlet (17b) that discharges outside of the at least one main room (4), and by natural convection, extracts the hot air from the hot air containment chamber (16) and discharging the extracted hot air outside of the at least one main room (4); and an open air circuit upstream of the outside air intake opening (23) and downstream of the downstream discharge outlet (17b), wherein cooling of the function equipment is exclusively performed by a combination of the ventilation means (11) of the functional equipment (2) and the natural convection means (19) without use of any hot-air extraction fans and fresh-air intake fans outside of the bays (8), said method comprising the steps of:

bringing the outside air at the temperature T1 into the mixing room (20) by natural convection;

in the mixing room (20), mixing the outside air that is thus brought in with an amount of air at a temperature that is different than T1 to thus produce the temperate air at the temperature T2;

bringing the temperate air at the temperature T2 from the mixing room (20) to the portion (14) of the at least one main room (4) that is outside of the hot air containment chamber (16);

using only natural convention, extracting the heated air, discharged from the air discharge passages (10a), from the hot air containment chamber (16); and discharging the extracted air via the hot-air extraction shaft (3), wherein the open air circuit is produced between the outside air intake opening (23) of the mixing room (20) and the downstream discharge outlet (17b) that discharges outside of the at least one main room (4).

20. The air-conditioning process according to claim 19, wherein the air at the temperature $T_2$ is brought from the mixing room (20) to the portion of the at least one main room (4) by a generally downward movement or a generally horizontal movement.

21. The air-conditioning process according to claim 19, wherein the air at the temperature $T_2$ is brought from the mixing room (20) to the portion (14) of the at least one main room (4) by a movement other than a movement that is generally upward starting from a floor (4a) or a raised floor (4b) of the at least one main room (4).

22. The air-conditioning process according to claim 19, wherein for mixing the outside air that is brought into the mixing room (20) with a suitable amount of air at a temperature that is higher than $T_1$, an amount of hot air that is extracted from the hot air containment chamber (16) by natural convection is sampled.

23. The air-conditioning process according to claim 19, wherein the natural convection is assisted statically in the hot-air extraction shaft (3).

24. The air-conditioning process according to claim 23, wherein the natural convection is assisted statically in the hot-air extraction shaft (3) by:

hot air being brought from the hot air containment chamber (16) by the natural convection by a segment (32a) that is upstream from the hot-air extraction shaft (3), from the upstream extraction intake (17a) up to an intermediate downstream outlet (33a), air that is located in at least one hot mixing room (34), in which the intermediate downstream outlet (33a) and an intermediate upstream intake (33b) of a downstream segment (32b) of the hot-air extraction shaft (3) having the downstream discharge outlet (17b) are located and into which they empty, is brought to a temperature $T_4$ that is higher than the temperature $T_3$, the hot air is extracted from the at least one hot mixing room (34) by natural convection, and the air that is extracted by the downstream segment (32b) from the hot-air extraction shaft (3) is discharged from the intermediate upstream intake (33b) up to a downstream discharge outlet (17b).

25. The air-conditioning process according to claim 19, wherein energy is recovered from the hot air that is extracted by the hot-air extraction shaft (3).

* * * * *